United States Patent [19]

Nakano

[11] Patent Number: 5,766,392
[45] Date of Patent: Jun. 16, 1998

[54] METHOD OF MANUFACTURING A MULTILAYER CERAMIC ELECTRONIC COMPONENT

[75] Inventor: Kiyoshi Nakano, Kyoto, Japan

[73] Assignee: Murata Manufacturing Co., Ltd., Kyoto-fu, Japan

[21] Appl. No.: 651,143

[22] Filed: May 22, 1996

Related U.S. Application Data

[62] Division of Ser. No. 177,944, Jan. 6, 1994, abandoned.

[30] Foreign Application Priority Data

Jan. 8, 1993 [JP] Japan .......................... 5-2088

[51] Int. Cl.$^6$ .......................................... B32B 31/26
[52] U.S. Cl. .................. 156/89; 156/277; 264/614
[58] Field of Search .................... 156/89, 277; 264/61, 264/614; 29/851; 252/514, 510; 427/125, 96

[56] References Cited

U.S. PATENT DOCUMENTS 4,748,085  5/1988  Fukuda et al. .................... 428/432
4,799,983  1/1989  Desai .................... 156/89

FOREIGN PATENT DOCUMENTS 49-122513  11/1974  Japan .
59-223764  12/1984  Japan .
4-214773   8/1992   Japan .
55816      8/1973   Romania .

*Primary Examiner*—Curtis Mayes
*Attorney, Agent, or Firm*—Ostrolenk, Faber, Gerb & Soffen, LLP

[57] ABSTRACT

In order to inhibit a fired multilayer ceramic electronic component from delamination resulting from combustion of resin contained in conductive paste which is applied to internal conductors of the multilayer ceramic electronic component, the conductive paste is prepared by adding at least 1 percent by weight of terpene sulfide and/or mercaptan of R—SH in which R is a hydrocarbon radical having 8–16 carbon atoms to metal powder of Pd, Ag or Pd-Ag as an additive and kneading the same with an organic vehicle.

6 Claims, 3 Drawing Sheets

METHOD OF MANUFACTURING A MULTILAYER CERAMIC ELECTRONIC COMPONENT

This is a division of application Ser. No. 08/177,944, filed Jan. 6, 1994, now abandoned.

BACKGROUND OF THE INVENTION

1. Field of the Invention

The present invention relates to conductive paste for internal conductors of a multilayer ceramic electronic component.

2. Description of the Background Art

A multilayer ceramic electronic component such as a multilayer ceramic capacitor or a ceramic multilayer substrate comprises a ceramic laminate, which is provided with internal conductors such as internal electrodes interposed between a plurality of ceramic layers forming the laminate.

For example, a multilayer ceramic capacitor is generally obtained by forming-internal electrodes on ceramic green sheets by printing, stacking and compression-bonding these ceramic green sheets with each other and firing the as-obtained multilayer block. A conductive paste which is employed for the internal electrodes is prepared by kneading powder of Pd, Ag, Pd-Ag or Pt with an organic vehicle.

However, a problem of delamination arises in the aforementioned preparation of a multilayer ceramic electronic component such as a multilayer ceramic capacitor. It has been explained that such delamination is caused by the difference in thermal expansion/contraction between ceramic layers and internal conductors. However, the inventor has observed a block during firing to confirm whether or not the above explanation is correct, and found that a defect which may have lead to delamination was present at a temperature of not more than 400° C. Thus, the inventor theorized that the delamination is caused when resin which is contained in the conductive paste for forming the internal conductors decomposes, and carried out differential thermal analysis (DTA) of the paste. Consequently, it has been recognized that the resin abruptly burns at a temperature of about 300° C. as clearly understood from samples 1, 9 and 15 shown in FIGS. 1, 2 and 3 as described later, to result in delamination.

SUMMARY OF THE INVENTION

An object of the present invention is to provide conductive paste for internal conductors of a multilayer ceramic electronic component, which can inhibit resin from the aforementioned abrupt combustion, thereby suppressing occurrence of delamination.

A conductive paste according to the present invention contains metal powder consisting of at least one material selected from a group of Pd, Ag and Pd-Ag, at least 1 percent by weight of an additive, consisting of at least one material selected from a group of terpene sulfide and mercaptan of R—SH in which R is a hydrocarbon radical having 8–16 carbon atoms, with respect to the metal powder, and an organic vehicle which is kneaded with the metal powder and the additive.

In the conductive paste according to the present invention the, terpene sulfide or mercaptan of R—SH is adapted to effect combustion of resin. The lower limit of the content of terpene sulfide and/or mercaptan is set at 1 percent by weight, more preferably at 3 percent by weight, since no effect is attained if the content is less than 1 percent by weight. On the other hand, the upper limit of the content is not particularly restricted and the material can be added to the paste unless printability of the paste and properties of the as-painted films are not damaged. However, the upper limit of the content is selected preferably at 20 percent by weight, more preferably at 10 percent by weight, in order to further ensure the effect of this additive for suppressing delamination.

According to the present invention, as hereinabove described, it is possible to suppress delamination by effecting combustion of resin which is contained in the conductive paste.

In order to prevent such delamination, a binder is generally slowly removed with a long time, particularly in a debindering stage of a firing step. According to the present invention, however, it is possible to obtain a multilayer ceramic electronic component while suppressing delamination, with no requirement for particular attention to firing conditions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
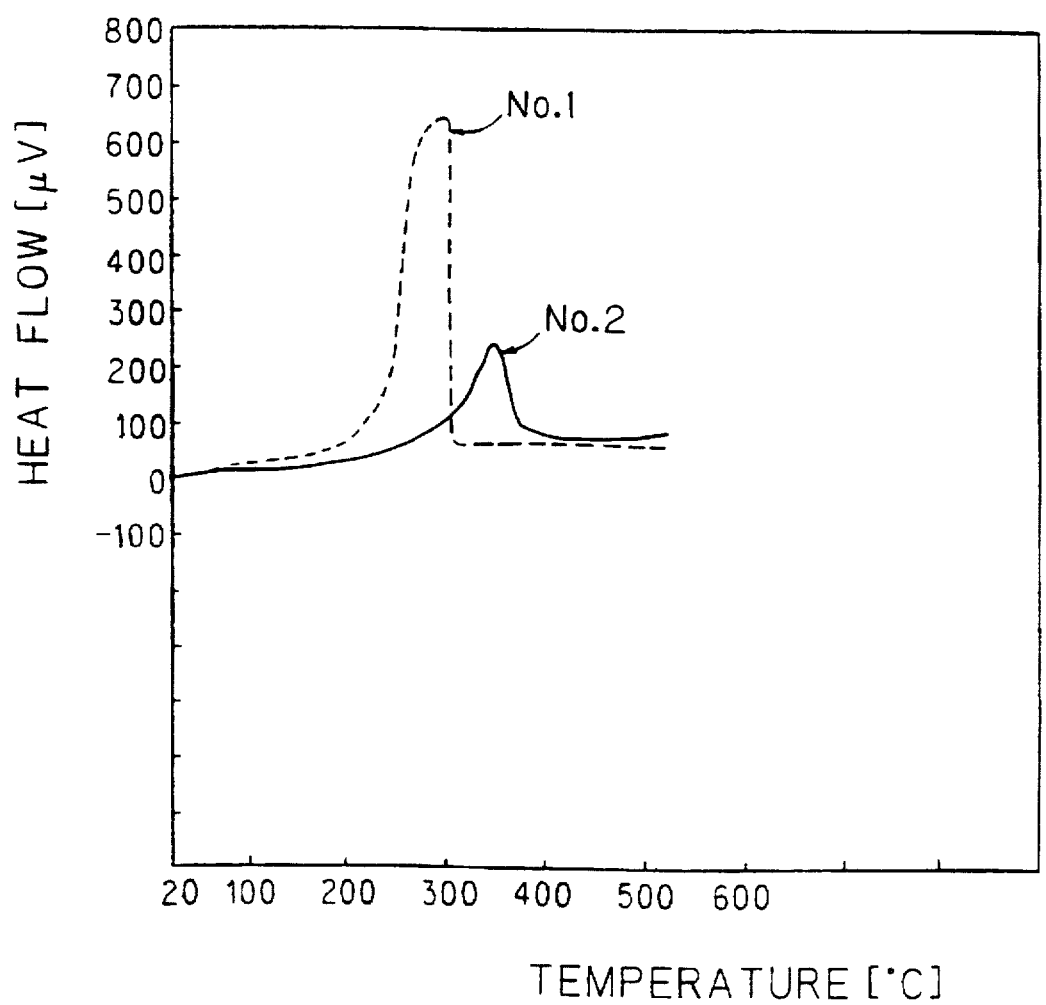
FIG. 1 illustrates results of differential thermal analysis on samples 1 and 2 in the Experimental Example carried out according to the present invention.

Terpene sulfide which is added to the conductive paste according to the present invention is prepared by adding sulfur to terpene such as pinene, dipentene, terpineol, geraniol or terpineol acetate. Rosin sulfide is prepared by adding sulfur to rosin which is dissolved in turpentine oil. Further, mercaptan of R—SH is prepared from that whose radical is a hydrocarbon radical having 8 to 16 carbon elements.

On the other hand, an organic binder which is contained in the organic vehicle is prepared from ethyl cellulose, butyral, or methyl methacrylate, ethyl methacrylate, or butyl methacrylate, or a polymer of such acrylates.

The experimental Example carried out according to the present invention is now described.

Metal powder materials were prepared from Pd, Ag and Pd-Ag, so that specific ones thereof were mixed with specific additives at specific rates, as shown in Table 1. These materials were kneaded with organic binders of ethyl cellulose and solvents of α-terpineol, to prepare conductive paste materials. The metal powder materials, the binders and the solvents were in mixing ratios of 50 percent by weight, 6 percent by weight and 44 percent by weight in samples 1 to 8 and 11 to 15 respectively, and 80 percent by weight, 4 percent by weight and 16 percent by weight in samples 9 and 10 respectively. Additives were employed as part of the solvents. The amounts of the solvents were reduced in response to those of the additives.

As to the samples 1 to 8, each paste was printed on barium titanate system ceramic green sheets of 20 µm in thickness. Forty such ceramic green sheets were stacked with each other so that five unprinted ceramic green sheets of the same composition were stacked on each of the uppermost and lowermost sheets. The ceramic green sheets were bonded to each other at a temperature of 40° C. under a pressure of 2 ton/m$^2$, and the as-obtained laminate was cut so as to be 3.2 mm by 1.6 mm in size after firing, and thereafter fired at 1250° C. for 2 hours.

The samples 9 and 10 were evaluated in the form of ferrite chips, each of which was prepared by printing a silver paste on Mn-Zn ferrite ceramic green sheets of 20 µm in thickness, stacking 10 such ceramic green sheets with each other, stacking 15 unprinted ceramic green sheets of the same composition on each of the uppermost and lowermost sheets, bonding the ceramic green sheets at a temperature of 40° C. under a pressure of 2 ton/cm$^2$, cutting the as-obtained laminate so as to be 3.2 mm by 1.6 mm in size after firing, and thereafter firing the same at 900° C. for 2 hours.

As to each of the samples 11 to 15, a 30 Pd/70 Ag paste was printed on low-temperature sintering barium titanate ceramic green sheets of 20 µm in thickness. Forty such ceramic green sheets were stacked with each other so that five unprinted ceramic green sheets were stacked on each of the uppermost and lowermost sheets. The ceramic green sheets were bonded to each other at a temperature of 40° C. under a pressure of 2 ton/m$^2$, and the as-obtained laminate was cut so as to be 3.2 mm by 1.6 mm in size after firing, and thereafter fired at a temperature of 1100° C. for 2 hours.

Sections of the aforementioned samples were observed to check occurrence/non-occurrence of separation of the ceramic layers, i.e., delamination. Table 1 shows the results.

TABLE 1

| Sample No. | Metal Powder | Additive (wt %) | Delamination (Separated/Total) |
|---|---|---|---|
| 1 | Pd | None | 60/100 |
| 2 | Pd | Terpineol Sulfide: 5 | 0/100 |
| 3 | Pd | Terpineol Sulfide: 10 | 0/100 |
| 4 | Pd | Terpineol Sulfide: 1 | 3/100 |
| 5 | Pd | C$_{12}$H$_{25}$SH: 5 | 0/100 |
| 6 | Pd 70 wt % Ag 30 wt % | None | 100/100 |
| 7 | Pd 70 wt % Ag 30 wt % | Geraniol Sulfide: 10 | 0/100 |
| 8 | Pd 70 wt % Ag 30 wt % | C$_8$H$_{17}$SH: 3 | 0/100 |
| 9 | Ag | None | 21/100 |
| 10 | Ag | Terpineol Sulfide: 5 | 0/100 |
| 11 | Pd 30 wt % Ag 70 wt % | Rosin Sulfide: 10 | 0/100 |
| 12 | Pd 30 wt % Ag 70 wt % | Terpineol Sulfide: 3 | 0/100 |
| 13 | Pd 30 wt % Ag 70 wt % | Terpineol Sulfide: 3 Rosin Sulfide: 1 C$_{12}$H$_{25}$SH: 1 | 0/100 |
| 14 | Pd 30 wt % Ag 70 wt % | Rosin Sulfide: 1 C$_{12}$H$_{25}$SH: 2 | 0/100 |
| 15 | Pd 30 wt % Ag 70 wt % | None | 100/100 |

As clearly understood from Table 1, absolutely no delamination took place in the samples employing the conductive paste materials containing at least 3 percent by weight of terpene sulfide, rosin sulfide or mercaptan, or mixtures thereof, i.e., the samples 2, 3, 5, 7, 8, 10 and 11 to 14. Also in the sample employing the conductive paste containing only 1 percent by weight of terpene sulfide, more specifically terpineol sulfide, i.e., sample 4, it was possible to remarkably suppress occurrence of delamination as compared with the sample 1 containing no such additive.

Figure 2:
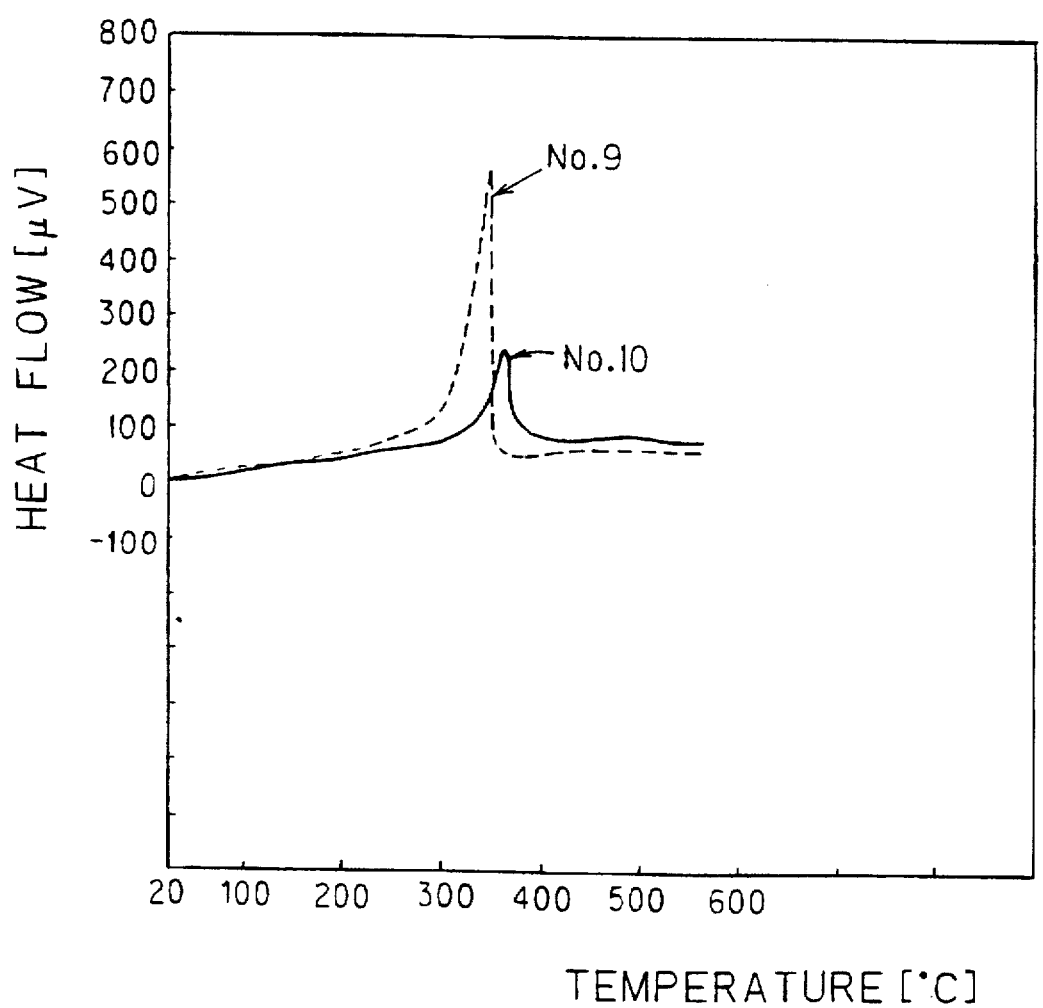
FIG. 2 illustrates results of differential thermal analysis on samples 9 and 10 in the Experimental Example carried out according to the present invention.
Figure 3:
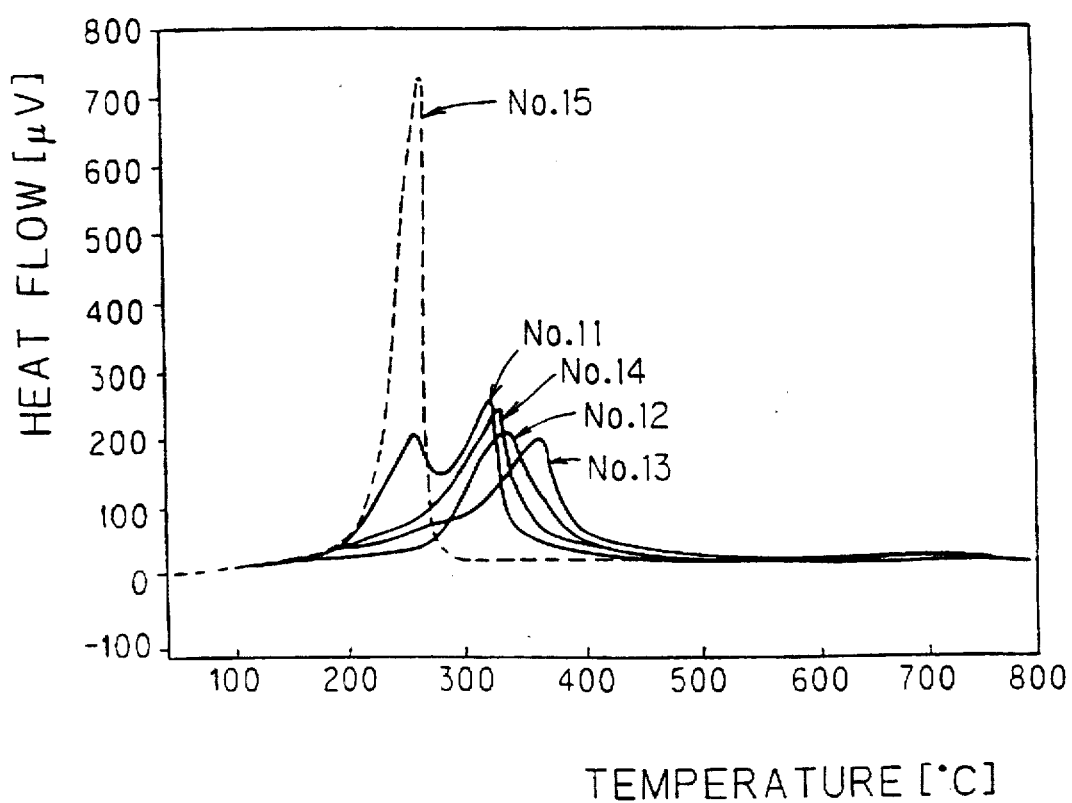
FIG. 3 illustrates results of differential thermal analysis on samples 11 to 15 in the Experimental Example carried out according to the present invention.

FIGS. 1 to 3 show results of DTA carried out on specific samples. FIG. 1 shows the results of the samples 1 and 2 and FIG. 2 shows those of the samples 9 and 10, while FIG. 3 shows those of the samples 11 to 15. The samples 1 and 9 were different from the samples 2 and 10 only in that the same contained no terpineol sulfide. On the other hand, the samples 11 to 14 were different from the sample 15 in that the same contained additives. It is understood from FIGS. 1 to 3 that the samples 2, 10 and 11 to 14 containing the additives exhibited lower combustion heat values as compared with the samples 1, 9 and 15 containing no additives.

The conductive paste according to the present invention is applicable not only to internal conductors of a multilayer ceramic capacitor, but to those of other multilayer ceramic electronic components such as a multilayer inductor, a multilayer varistor and a multilayer substrate, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a multilayer ceramic electronic component, comprising the steps of:

preparing a ceramic green sheet, preparing conductive paste for internal conductors, the conductive paste containing metal powder consisting of at least one material selected from a group of Pd, Ag and Pd-Ag, at least 1% by weight based on the metal powder of at least one additive selected from the group of terpene sulfide and mercaptan of the formula R—SH in which R is a hydrocarbon radical having 8–16 carbon atoms, and an organic vehicle, printing said conductive paste on the surface of the ceramic green sheet, forming a laminate by stacking a plurality of ceramic green sheets having conductive paste thereon, and firing said laminate.

2. Method in accordance with claim 1, containing at least 3% by weight of said additive with respect to the said metal powder.

3. Method in accordance with claim 2, wherein the additive is said terpene sulfide and the terpene thereof is selected from the group consisting of pinene, dipentene, terpineol, geraniol and terpineol acetate.

4. Method in accordance with claim 1, wherein the additive is said mercaptan.

5. Method in accordance with claim 1, wherein the amount of said additive is in the range of 1 to 20% by weight based on the metal powder.

6. Method in accordance with claim 1, wherein the amount of said additive is in the range of 3 to 10% by weight based on the metal powder.

* * * * *